United States Patent [19]
Babb et al.

[11] Patent Number: 5,130,896
[45] Date of Patent: Jul. 14, 1992

[54] APPARATUS FOR ELECTROMAGNETIC INTERFERENCE CONTAINMENT FOR PRINTED CIRCUIT BOARD CONNECTORS

[75] Inventors: Samuel M. Babb; David O. Merrill, both of Fort Collins, Colo.

[73] Assignee: Hewlett-Packard Company, Palo Alto, Calif.

[21] Appl. No.: 658,944

[22] Filed: Feb. 22, 1991

[51] Int. Cl.⁵ .................................................. H05K 9/00
[52] U.S. Cl. ............................... 361/424; 174/35 R; 174/35 C; 174/35 GC; 174/51; 361/399; 361/413; 361/414; 439/62; 439/65; 439/66; 439/95; 439/96; 439/97; 439/108; 439/607
[58] Field of Search ............ 174/35 R, 35 GC, 35 TS, 174/51, 35 C; 357/84; 361/392, 393, 394, 399, 413, 414, 424, 426; 439/92, 101, 108, 607, 62, 65, 66, 95, 96, 97

[56] References Cited

U.S. PATENT DOCUMENTS

| | | | |
|---|---|---|---|
| 4,218,578 | 8/1980 | Olschewski et al. | 174/35 R |
| 4,521,062 | 6/1985 | Kurbikoff et al. | 439/607 |
| 4,915,652 | 4/1990 | Madara | 439/607 |
| 4,943,244 | 7/1990 | Teck et al. | 439/607 |
| 5,006,079 | 4/1991 | Okamoto et al. | 439/607 |

FOREIGN PATENT DOCUMENTS 0072480 3/1989 Japan .................................. 439/101

OTHER PUBLICATIONS

IBM Disclosure Bulletin "Connector Shield/Bracket to Provide Electromagnetic Compatibility", vol. 30, No. 6.

IBM Disclosure Bulletin "EMI Shield-to-Connector Attachment" vol. 32 No. 3B.

Primary Examiner—Leo P. Picard
Assistant Examiner—D. Sparks
Attorney, Agent, or Firm—Guy J. Kelley

[57] ABSTRACT

A printed circuit board for mounting in a housing, having a mounted connector for making connections with the circuit board through the housing includes a layer formed from electrically insulating material and a conductive structure formed on such layer which conductive structure is adapted to be connected to ground. A casing, also formed from electrically conductive material, is shaped to surround a portion of the connector and is electrically connected to the conductive structure so that electromagnetic radiation emanating from the circuit board will not pass through the connector. In embodiments where the connector is mounted on an edge of said circuit board, the casing surrounds all of but the open end of the connector. In a preferred embodiment the casing includes a top portion, connected to the conductive structure, for surrounding the top of the connector and a bottom portion, also connected to the conductive structure, for surrounding the bottom portion of the connector. In such an embodiment, it is preferred that the top portion include a plurality of legs. The casing is electrically connected to the conductive structure by connecting the legs to the conductive structure. It is also preferred to extend the conductive structure through the circuit board and electrically connect the bottom half of the casing to the conductive structure. In such an embodiment it is preferred to place a silver loaded elastomer between the conductive structure and the bottom half.

11 Claims, 1 Drawing Sheet

APPARATUS FOR ELECTROMAGNETIC INTERFERENCE CONTAINMENT FOR PRINTED CIRCUIT BOARD CONNECTORS

FIELD OF INVENTION

The present invention relates generally to the control of electromagnetic interference from printed circuit boards and more particularly to the control of electromagnetic interference generated or present in the region of a printed circuit board connector.

BACKGROUND OF THE INVENTION

Electromagnetic interference (EMI) is a generic term for unwanted interference energies either conducted as currents or radiated as electromagnetic fields. EMI can emanate from computers or other digital devices in several ways. Generally, voltages and currents in board mounted, integrated switching circuits create electric and magnetic fields that radiate from the device. EMI radiating from such devices will vary in field strength and impedance according to the shape and orientation of the conductors, the distance from the conductors to any shielding provided by circuit components or by coupling to circuit components.

Since most computers operate by generating pulse signals at rates in excess of a million pulses per second, radiating EMI will extend into the radio frequency spectrum and can cause significant interference with radio and television signals. The United States Federal Communications Commission has promulgated rules and procedures requiring the minimization and regulation of EMI by manufacturers. Under such regulations, EMI must be limited for certain devices to particular micro-volt ranges depending on the frequency of the EMI signal.

In lieu of the problems surrounding EMI and the need to comply with government regulations, various schemes have been proposed for limiting EMI. One typical scheme has been to provide a conductive enclosure to an electronic device so that EMI field lines will terminate on such enclosure. Unfortunately, field lines may still emanate from such enclosures, particularly at the point of connection with the printed circuit board, i.e. at the connector.

Consequently, a need exists for controlling EMI emanating from a printed circuit board, even if contained in an enclosure, whereby EMI emanating from the point of connection to the printed circuit board is eliminated.

SUMMARY OF THE INVENTION

The objects and advantages of the invention are achieved in a printed circuit board for mounting in a housing, having a mounted connector for making connections with the circuit board through the housing. The circuit board is shown to include a layer formed from electrically insulating material and a conductive structure formed on such layer which conductive structure is preferably adapted to be connected to ground. A casing, also formed from electrically conductive material, is shaped to surround a portion of the connector and is electrically connected to the conductive structure so that electromagnetic radiation emanating from the circuit board will not pass through the connector. In embodiments where the connector is mounted on an edge of said circuit board, the casing surrounds all of but the open end of the connector. In a preferred embodiment the casing includes a top portion, connected to the conductive structure, for surrounding the top of the connector and a bottom portion, also connected to the conductive structure, for surrounding the bottom portion of the connector. In such an embodiment, it is preferred for the top portion to include a plurality of legs. The casing is electrically connected to the conductive structure by connecting the legs to the conductive structure. It is also preferred to extend the conductive structure through the circuit board and electrically connect the bottom half of the casing to the conductive structure. In such a situation it is preferred to place a silver loaded elastomer between the conductive structure and the bottom half.

In an especially preferred embodiment, the casing includes an upstanding side wall, a top wall extending substantially perpendicular from the side wall, a front wall extending substantially perpendicular from the top wall and two end walls attached to the side wall and the top wall thereby defining a cavity, which cavity surrounds the top half of the connector. In such an embodiment the housing is formed from conductive material and further includes a connector, such as an electrically conductive bolt, for electrically connecting the casing to the housing. In such a situation, the casing and the housing form a continuous conductive structure surrounding the closed portions of the connector.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
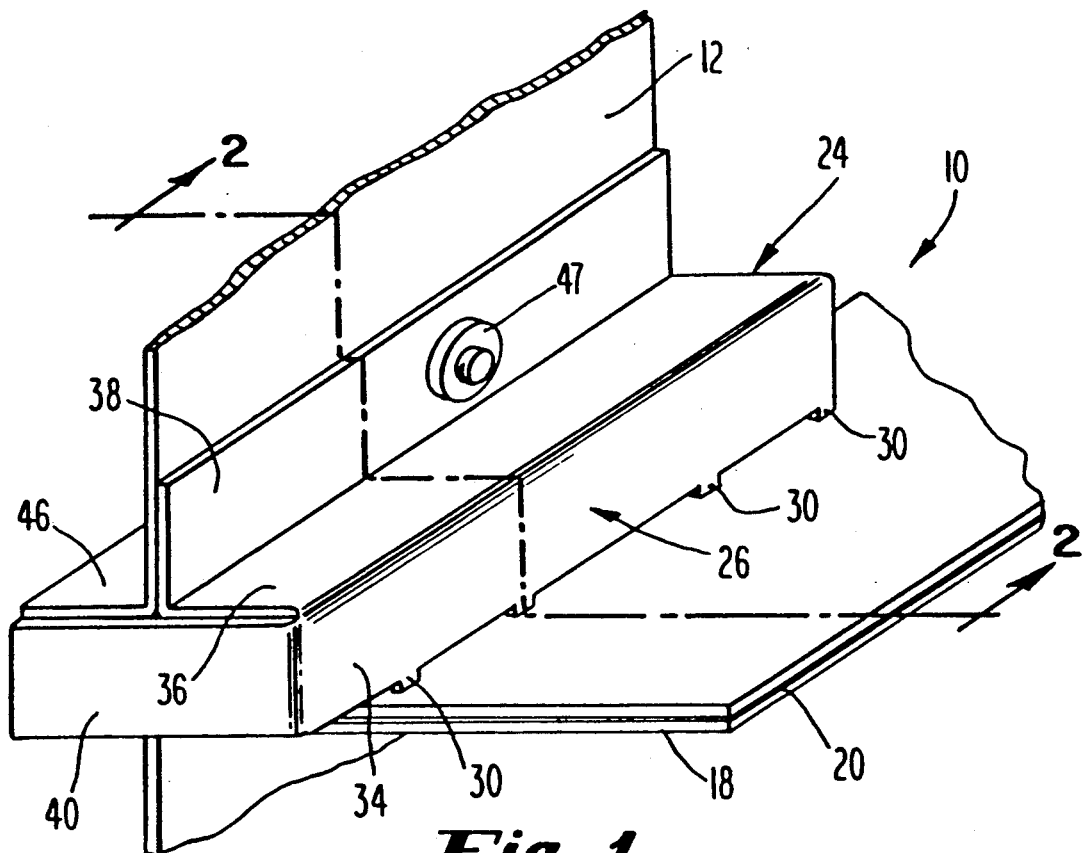
FIG. 1 is a perspective view of a printed circuit board and connector constructed in accordance with the present invention.
Figure 2:
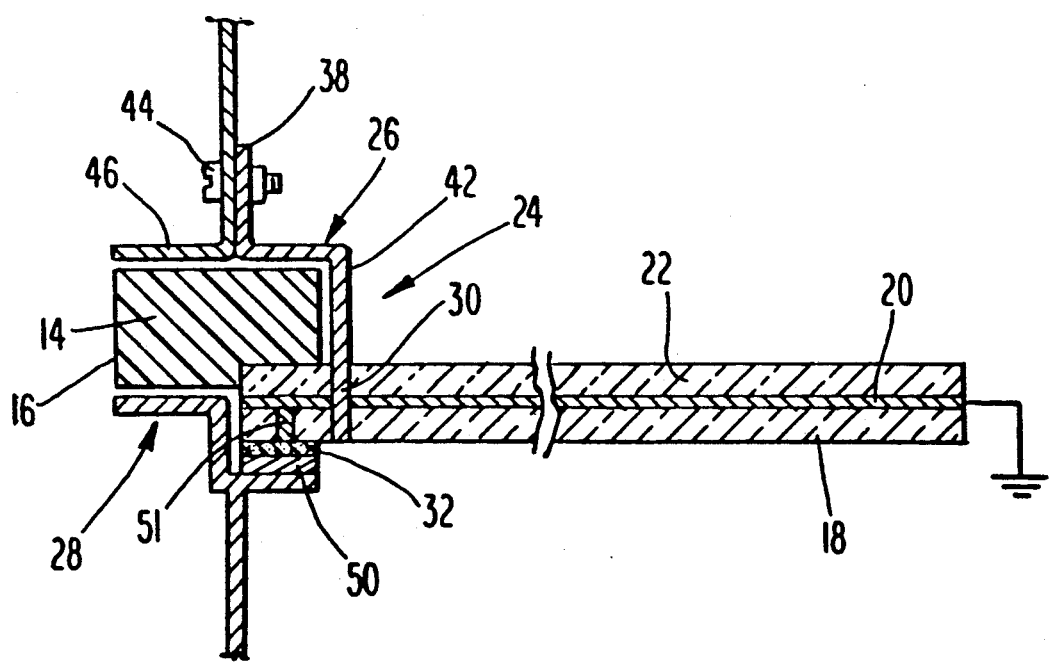
FIG. 2 is a section view along the line 2—2 of FIG. 1.

A new and novel printed circuit board, constructed in accordance with the present invention, is shown in FIG. 1 and generally designated 10. Circuit board 10 is adapted to be mounted within housing 12. It is assumed that housing 12 is formed from an electrically conductive material. A connector 14 (shown in FIG. 2) is mounted on circuit board 10 for making connections with the circuit board through housing 12. As shown in FIG. 2, connector 14 has an open end 16 which faces away from circuit board 10.

As shown in FIGS. 1 and 2, circuit board 10 includes a layer 18 formed from electrically insulating material, such as glass epoxy. A conductive structure 20 is formed on layer 18. As shown in FIG. 2, is adapted to be connected to ground by any suitable means. A further insulating layer 22 is formed over conductive structure 20. Although only two insulating layers are shown, it will be appreciated that printed circuit board 10 can include multiple layers and need not be limited to the two layers shown herein.

A casing 24, formed from electrically conductive material, is shaped to surround a portion of connector 14 and is electrically connected to conductive structure 20. Electromagnetic radiation emanating from circuit board 10 will terminate on casing 24 or on conductive structure 20 and thus, will not pass through connector 14.

As shown in FIG. 2, connector 14 is mounted on an edge of circuit board 10 and casing 24 surrounds all of connector 14 except for open end 16. In that embodiment, casing 24 includes too portion 26 shown to be connected to conductive structure 20. Top portion 26 surrounds the top and back of connector 14. Casing 24 also includes a bottom portion 28, also connected to conductive structure 20, which surrounds the bottom of connector 14. As shown in FIGS. 1 and 2, top portion 26 includes a plurality of legs 30 which are positioned within corresponding bores in circuit board 10. Legs 30 are shown to extend through circuit board 10 and are electrically connected to conductive structure 20 by any suitable means. Bottom half 28 is electrically connected to conductive structure 20 by being electrically connected to conductive element 50. A connecting member 32 is interposed between conductive element 50 and printed circuit board 10. In the preferred embodiment, this connection member is a silver loaded elastomer 32. Conductive element 50 is connected to conductive structure 20 via connecting member 32 and conductive member 51. Conductive member 51 can be formed from any conductive material which can be adapted to be positioned in an appropriate bore in layer 18.

As will be appreciated from FIGS. 1 and 2, top portion 26 includes an upstanding side wall 34, a top wall 36 which extends substantially perpendicular from side wall 34 and a front wall 38, which extends substantially perpendicular from top wall 36. Two end walls (only one is shown) 40 are attached to either end of side wall 34. Side wall 34, top wall 36 and end walls 40 thereby define a cavity 42 which cavity surrounds the upper and side portions of connector 14

A connector 44 is utilized to electrically connect casing 24 to housing 12. As shown in FIGS. 1 and 2, connector 44 is a bolt which passes through suitable holes in housing 12 and front wall 38 for connection with threaded member 46. In this way, front wall 38 and housing 12 are electrically connected. Such electrical connection results in a continuous conductive structure surrounding the closed portion of connector 14. As shown in FIGS. 1 and 2, housing 12 includes an outwardly extending wall 46.

In an especially preferred embodiment, side wall 34, top wall 36, front wall 38 and end walls 40 are integrally formed.

While the invention has been described and illustrated with reference to specific embodiments, those skilled in the art will recognize that modification and variations may be made without departing from the principles of the invention as described herein above and set forth in the following claims.

What is claimed is:

1. Apparatus for reducing electromagnetic interference emanating from a printed circuit board mounted in a housing, wherein said housing is formed from a conductive material, said circuit board having a first connector mounted thereon for making connections with said circuit board through said housing, said first connector having an open end, said circuit board further comprising:
   a layer formed from electrically insulating material;
   a conductive structure formed on said layer and adapted to be connected to ground;
   a casing, formed from electrically conductive material, said casing being shaped to surround a portion of said first connector and electrically connected to said conductive structure so that electromagnetic radiation emanating from said circuit board will not pass through said connector; and
   a second connector for electrically connecting said casing to said housing, wherein said casing and said housing form a continuous conductive structure surrounding the closed portions of said first connector.

2. The circuit board of claim 1, wherein said first connector is mounted to an edge of said circuit board and wherein said casing surrounds all of said first connector except for said open end.

3. The circuit board of claim 2, wherein said casing comprises a top portion, connected to said conductive structure, for surrounding the top of said first connector and a bottom portion, connected to said conductive structure, for surrounding the bottom portion of said first connector.

4. The circuit board of claim 3, wherein said circuit board has a plurality of bores passing therethrough and wherein said top portion comprises a plurality of legs, wherein said casing is electrically connected to said conductive structure by said legs being positioned in said bores and connected to said conductive structure.

5. The circuit board of claim 4, wherein said conductive structure extends through said layer and wherein said bottom portion of said casing is electrically connected to said conductive structure.

6. The circuit board of claim 5, wherein a third connector is interposed between said bottom portion and said conductive structure.

7. The circuit board of claim 6, wherein said third connector comprises a silver loaded elastomer.

8. The circuit board of claim 3, wherein said top portion of said casing comprises an upstanding side wall, a top wall extending substantially perpendicular from said side wall, a front wall extending substantially perpendicular from said top wall and two end wall attached to said side wall and said top wall said casing surrounds said top portion of said first connector.

9. The circuit board of claim 8, wherein said second connector is an electrically conductive bolt.

10. The circuit board of claim 9, wherein said front wall has a first hole formed therethrough and wherein said housing has a second hole formed therethrough and wherein said bolt electrically connects said front wall to said housing by passing through said first and second holes.

11. The circuit board of claim 8, wherein the side, top, front and end walls of said casing are integrally formed.

* * * * *

UNITED STATES PATENT AND TRADEMARK OFFICE
CERTIFICATE OF CORRECTION

PATENT NO. :    5,130,896

DATED      :    July 14, 1992

INVENTOR(S) :   Samuel M. Babb, David O. Merrill

It is certified that error appears in the above-identified patent and that said Letters Patent is hereby corrected as shown below:

Column 4, line 46, "wall" should read --walls--.

Signed and Sealed this

Twenty-fourth Day of August, 1993

Attest:

BRUCE LEHMAN

Attesting Officer            Commissioner of Patents and Trademarks